(12) United States Patent
Lim

(10) Patent No.: US 11,390,748 B2
(45) Date of Patent: Jul. 19, 2022

(54) DUALLY-CURABLE RESIN COMPOSITION, CURED BODY PREPARED THEREFROM, AND ELECTRONIC DEVICE COMPRISING SUCH CURED BODY

(71) Applicant: DOW SILICONES CORPORATION, Midland, MI (US)

(72) Inventor: Jong-Ok Lim, Midland, MI (US)

(73) Assignee: DOW SILICONES CORPORATION, Midland, MI (US)

( * ) Notice: Subject to any disclaimer, the term of this patent is extended or adjusted under 35 U.S.C. 154(b) by 2 days.

(21) Appl. No.: 16/634,821

(22) PCT Filed: Jul. 31, 2018

(86) PCT No.: PCT/US2018/044586
§ 371 (c)(1),
(2) Date: Jan. 28, 2020

(87) PCT Pub. No.: WO2019/028013
PCT Pub. Date: Feb. 7, 2019

(65) Prior Publication Data
US 2020/0207985 A1 Jul. 2, 2020

(30) Foreign Application Priority Data

Jul. 31, 2017 (KR) ........................ 10-2017-0097097

(51) Int. Cl.
| | | |
|---|---|---|
| C08L 83/06 | (2006.01) | |
| C08G 77/16 | (2006.01) | |
| C09J 183/06 | (2006.01) | |
| H01L 23/29 | (2006.01) | |

(52) U.S. Cl.
CPC .............. *C08L 83/06* (2013.01); *C08G 77/16* (2013.01); *C09J 183/06* (2013.01); *H01L 23/296* (2013.01); *C08L 2205/025* (2013.01)

(58) Field of Classification Search
CPC ........ C08G 77/08; C08G 77/16; C08G 77/18; C08G 77/20; C08G 77/28; C08K 5/5397; C08K 5/5415; C08L 83/04; C08L 83/06; C08L 2205/025; C08J 183/04; C08J 183/06; H01L 23/296
See application file for complete search history.

(56) References Cited

U.S. PATENT DOCUMENTS

| | | | | | |
|---|---|---|---|---|---|
| 4,269,963 | A * | 5/1981 | Homan | ................ | C08G 77/392 524/588 |
| 4,290,869 | A * | 9/1981 | Pigeon | .................. | C08G 77/20 428/438 |
| 4,528,081 | A * | 7/1985 | Lien | ....................... | C08G 77/20 522/39 |
| 4,608,312 | A * | 8/1986 | Eckberg | ............... | C09D 183/08 428/419 |
| 4,946,874 | A * | 8/1990 | Lee | ....................... | C03C 25/106 522/14 |
| 4,952,711 | A * | 8/1990 | Jacobine | ................ | C08L 83/06 522/24 |
| 5,124,212 | A * | 6/1992 | Lee | ....................... | C03C 25/106 428/429 |
| 5,169,879 | A * | 12/1992 | Lee | ....................... | C03C 25/106 522/14 |
| 5,212,211 | A * | 5/1993 | Welch, II | ............... | C08G 77/50 522/172 |
| 5,399,651 | A * | 3/1995 | Gentle | ................... | C08G 77/20 528/15 |
| 5,516,823 | A * | 5/1996 | Gentle | ................. | C08K 5/5419 524/264 |
| 5,684,113 | A * | 11/1997 | Nakanishi | ............... | C08L 83/00 528/30 |
| 5,753,720 | A * | 5/1998 | Nakanishi | .............. | C09J 183/04 428/452 |
| 6,451,870 | B1 * | 9/2002 | DeCato | ................... | C08L 83/06 522/99 |
| 6,827,985 | B2 * | 12/2004 | Levandoski | ............ | C08L 83/04 427/387 |
| 7,893,170 | B2 * | 2/2011 | Wakioka | ............... | C08K 5/0091 525/477 |
| 10,035,911 | B2 * | 7/2018 | Sarkar | ..................... | C08L 83/06 |
| 10,604,653 | B2 * | 3/2020 | Dogen | .................... | C08L 83/08 |
| 2004/0209972 | A1* | 10/2004 | Chambers | ................ | C08J 3/243 522/148 |
| 2008/0076878 | A1* | 3/2008 | Wakioka | ................ | C08K 5/544 525/190 |
| 2010/0069523 | A1* | 3/2010 | Alvarez | ............... | C09D 183/14 528/33 |
| 2012/0046423 | A1 | 2/2012 | Koh et al. | | |

(Continued)

FOREIGN PATENT DOCUMENTS

| | | |
|---|---|---|
| CN | 103992650 A | 8/2014 |
| WO | 2013146130 A1 | 10/2013 |
| WO | 2015098118 A1 | 7/2015 |
| WO | 2019028013 | 2/2019 |

OTHER PUBLICATIONS

International Search Report for PCT/US2018/044586 dated Oct. 19, 2018, 5 pages.

(Continued)

*Primary Examiner* — Sanza L. McClendon
(74) *Attorney, Agent, or Firm* — Warner Norcross + Judd LLP

(57) ABSTRACT

A dually curable resin composition is provided. The composition comprises: (A) a first polyorganosiloxane comprising at least one alkenyl group and at least one alkoxy group in one molecule; (B) a second polyorganosiloxane comprising at least two photoreactive functional groups in one molecule on its side chain of siloxane backbone; (C) at least one silane compound represented by a particular chemical formula herein or its partially hydrolyzed compound; (D) at least one photoinitiator; and (E) at least one condensation reaction catalyst. A cured body prepared by curing the dually curable resin composition, and an electronic device comprising the cured body, are also provided.

13 Claims, No Drawings

(56) References Cited

U.S. PATENT DOCUMENTS

| | | | | |
|---|---|---|---|---|
| 2014/0332987 A1* | 11/2014 | Kamuro | ............ | C08K 5/34924 |
| | | | | 257/791 |
| 2015/0355378 A1* | 12/2015 | Wolter | ................ | C09D 143/04 |
| | | | | 526/279 |
| 2015/0368514 A1* | 12/2015 | Kamuro | ............... | C08K 5/5435 |
| | | | | 524/588 |
| 2017/0283671 A1* | 10/2017 | Hynes | ....................... | C09J 5/06 |
| 2018/0334587 A1 | 11/2018 | Betzig et al. | | |
| 2021/0139703 A1* | 5/2021 | Lim | ....................... | C08L 83/04 |

OTHER PUBLICATIONS

Database WPI Week 201475 Thomson Scientific, London, GB; AN 2014-U57532 XP002785544, 2 pages.
Database WPI Week 201370 Thomson Scientific, London, GB; AN 2013-Q06791 XP002785545, 3 pages.
Machine assisted English translation of WO2013146130A1 obtained from https://patents.google.com/patent on Apr. 28, 2020, 27 pages.
Machine assisted English translation of CN103992650A obtained from https://patents.google.com/patent on Apr. 28, 2020, 8 pages.
Taylor et al., "Nuclear Magnetic Resonance Spectroscopy", The Analytical Chemistry of Silicones, A. Lee Smith, John Wiley & Sons NY, 1991, 9 pages, vol. 112, Chapter 12.

\* cited by examiner

DUALLY-CURABLE RESIN COMPOSITION, CURED BODY PREPARED THEREFROM, AND ELECTRONIC DEVICE COMPRISING SUCH CURED BODY

CROSS-REFERENCE TO RELATED APPLICATIONS

This application is the National Stage of International Appl. No. PCT/US2018/044586 filed on 31 Jul. 2018, which claims priority to and all advantages of Korean Patent Application No. 10-2017-0097097, filed on 31 Jul. 2017, the content of which is incorporated herein by reference.

TECHNICAL FIELD

Dually-curable resin composition, cured body prepared therefrom, and electronic device comprising the cured body are disclosed.

BACKGROUND ART

Silicone materials are widely used not only in the consumption market but also sealants, adhesives, coatings, and potting compounds, etc., in industry. Such materials include room temperature vulcanizing (RTV) silicone which can be cured by moisture in air at room temperature, high temperature vulcanizing (HTV) silicone, and photo (UV-Vis) curable silicone, etc.

In general, a room temperature curable silicone material (or moisture curable silicone materials) is used as sealants and adhesives in electro-electronic devices since no separate heating process is required for curing. Such a room temperature curable silicone composition has the feature that when it has been cured in the state where it contacts an electrical circuit or electrode, the silicone cured body can be removed from that electrical circuit or electrode after a long time has elapsed, and repair and recycling are possible.

However, the room temperature curable silicone composition has a disadvantage in that it takes a long time until curing completely. And in case of general room temperature curable silicone composition, there has been a problem that the cured body is broken or it is caused cohesive failure when the silicone cured body is removed from the substrate, because it has good adhesion to the substrate.

Unlike the room temperature curable silicone composition, the photo curable silicone composition exhibits a very high reaction rate due to radical polymerization by UV-Vis light. Due to the fast curing rate of such photo curable silicone materials, it is possible to provide cured body very quickly.

However, the photo curable silicone composition has excellent curability in a surface area directly contacting with UV-Vis irradiation, but has poor curability in a shadow area, and in particular, there is a problem that material in such area, which is not UV-Vis irradiated, is not cured.

It has been desired to search for a dually curable composition which exhibits excellent properties for both room temperature curing and curing by UV-Vis irradiation without exhibiting the disadvantages of the known curable silicone materials as described above.

PRIOR ART DOCUMENT

Patent Document 1: Publication WO 2015/098118 (2015 Jul. 2)

BRIEF SUMMARY OF INVENTION

Technical Problem

One embodiment provides a dually-curable resin composition that can be quickly cured by photo and a high degree of hardness as well as excellent curability in shadow area, excellent adhesion and releasability.

Another embodiment provides a cured body prepared by curing the dually-curable resin composition.

Yet another embodiment provides an electronic device comprising the cured body.

Solution to Problem

According to one embodiment, a dually-curable resin composition is provided which comprises (A) a first polyorganosiloxane comprising at least one alkenyl group and at least one alkoxy group in one molecule; (B) a second polyorganosiloxane comprising at least two photoreactive functional groups in one molecule on its side chain of siloxane backbone; (C) at least one silane compound represented by the following Chemical Formula 1 or its partially hydrolyzed compound; (D) at least one photoinitiator; (E) at least one condensation reaction catalyst:

  [Chemical Formula 1]

wherein, in Chemical Formula 1, $R^X$ is a monovalent hydrocarbon group, X is C1 to C20 alkoxy group, a hydroxy group, halogen, a carboxyl group, or a combination thereof.

The first polyorganosiloxane may be represented by the following Chemical Formula 2.

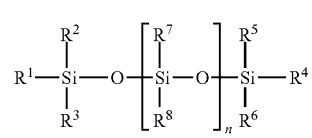  [Chemical Formula 2]

wherein, in Chemical Formula 2, $R^1$ to $R^8$ are each independently substituted or unsubstituted C1 to C20 alkyl, substituted or unsubstituted C3 to C20 cycloalkyl, substituted or unsubstituted C2 to C20 alkenyl, substituted or unsubstituted C2 to C20 alkynyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof; however, at least one of $R^1$ to $R^6$ is substituted or unsubstituted C2 to C20 alkenyl, and at least one of $R^1$ to $R^6$ is substituted or unsubstituted C1 to C20 alkoxy, n is an integer ranging from 50 to 1,000.

The photoreactive functional group may be a mercapto group.

In Chemical Formula 2, at least one of $R^1$ to $R^6$ may be substituted or unsubstituted C2 to C10 alkenyl, and at least two of $R^1$ to $R^6$ is substituted or unsubstituted C1 to C10 alkoxy.

The second polyorganosiloxane represented by the following Chemical Formula 3:

[Chemical Formula 3]

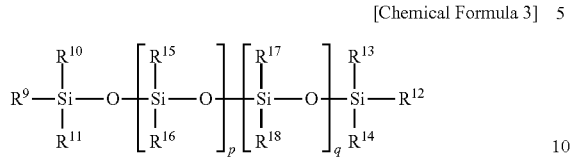

wherein, in Chemical Formula 3, $R^9$ to $R^{14}$ are each independently substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof, $R^{15}$ to $R^{18}$ are each independently a mercapto group, a monovalent hydrocarbon group comprising a mercapto group, substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, or a combination thereof; however, at least one of $R^{17}$ and $R^{18}$ is a mercapto group or monovalent hydrocarbon group comprising a mercapto group, and p is an integer ranging from 0 to 100 and q is an integer ranging from 2 to 100.

In Chemical Formula 3, $R^{15}$ and $R^{16}$ may be each independently are each substituted or unsubstituted C1 to C20 alkyl, $R^{17}$ or $R^{18}$ may be a monovalent hydrocarbon group comprising a mercapto group, p may be an integer ranging from 0 to 100 and q may be an integer ranging from 2 to 100.

In Chemical Formula 3, $R^9$ to $R^{14}$ may be each independently substituted or unsubstituted C1 to C10 alkyl.

In Chemical Formula 1, $R^x$ may be substituted or unsubstituted C1 to C4 alkyl, and X is C1 to C6 alkoxy.

The photoinitiator (D) may comprise at least one of 2,4,6-trimethylbenzoyl diphenyl phosphine oxide, bis(2,4,6-trimethylbenzoyl)-phenyl phosphine oxide and ethyl(2,4,6-trimethylbenzoyl)phenyl phosphinate.

The condensation reaction catalyst (E) may comprise at least one of tetra(isopropoxy) titanium, tetra(n-butoxy) titanium, tetra(t-butoxy) titanium, di(isopropoxy)bis(ethylacetoacetate) titanium, and di(isopropoxy)bis(methylacetoacetate) titanium, di(isopropoxy)bis(acetylacetonate) titanium.

The dually curable resin composition may comprise 1 to 30 parts by weight of (B) the second polyorganosiloxane, 0.5 to 30 parts by weight of (C) the silane compound or its partially hydrolyzed compound, 0.05 to 5 parts by weight of (D) the photoinitiator, and 0.01 to 10 parts by weight of (E) the condensation reaction catalyst with respect to the 100 parts by weight of (A) the first polyorganosiloxane.

The dually curable resin composition may further comprise (F) additives comprising at least one of a reinforcing filler, a photopolymerization inhibitor and a pigment.

According to another embodiment, a cured body preparing by curing the dually curable resin composition is provided.

According to a further embodiment, an electronic device comprising the cured body is provided.

Effect of the Invention

A dually curable resin composition according to one embodiment can be quickly cured by photo and has excellent curability in shadow area.

Also, a cured body prepared by curing the dually curable composition according to one embodiment exhibits a high degree of hardness and excellent adhesion and releasability, thus exhibiting excellent repairability and re-workablity when used in an electronic device.

DETAILED DESCRIPTION OF THE EMBODIMENTS

Hereinafter, exemplary embodiments of the present invention will be described in detail. The exemplary embodiments serve as examples embodied for describing the present invention without being limited to the scope of the present invention.

As used herein, when a specific definition is not otherwise provided, the term "monovalent hydrocarbon group" may refer to an alkyl group, a cycloalkyl group, an alkenyl group, an aryl group, an arylalkyl group, or a halogenated alkyl group.

As used herein, when a specific definition is not otherwise provided, the term "alkyl" may refer to a C1 to C20 alkyl, the term "cycloalkyl" may refer to C3 to C20 cycloalkyl, the term "alkenyl" may refer to a C2 to C20 alkenyl, the term "aryl" may refer to C6 to C20 aryl, the term "arylalkyl" may refer to C6 to C20 arylalkyl, the term "halogenated alkyl" may refer to a C1 to C20 alkyl group wherein at least one hydrogen of the alkyl group is substituted with at least one of halogen groups.

As used herein, when a specific definition is not otherwise provided, the term "substituted" may refer to one substituted with at least one substituent comprising halogen (F, Br, Cl, or I), a hydroxy group, C1 to C20 alkoxy group, a nitro, a cyano group, an amino group, an azido group, an amidino group, a hydrazino group, a hydrazono group, a carbonyl group, a carbamyl group, a mercapto group (a thiol group), an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group or a combination thereof, instead of hydrogen of a compound.

As used herein, when a specific definition is not otherwise provided, the term "hetero" may refer to at least one heteroatom selected from N, O, S, and P in one chemical formula.

As used herein, when a specific definition is not otherwise provided, the term "combination" refers to mixing or copolymerization.

Hereinafter, a dually curable resin composition according to one embodiment is described.

According to one embodiment, a dually-curable resin composition is provided which comprises (A) a first polyorganosiloxane comprising at least one alkenyl group and at least one alkoxy group in one molecule; (B) a second polyorganosiloxane comprising at least two photoreactive functional groups in one molecule on its side chain of siloxane backbone; (C) at least one silane compound represented by the following Chemical Formula 1 or its partially hydrolyzed compound; (D) at least one photoinitiator; (E) at least one condensation reaction catalyst:

$$(R^x)_2 SiX_2 \quad \text{[Chemical Formula 1]}$$

wherein, in Chemical Formula 1, $R^x$ is a monovalent hydrocarbon group, and X is C1 to C20 alkoxy group, a hydroxy group, halogen, a carboxyl group, or a combination thereof.

The conventional photocurable silicone composition is suitable for rapid curing process, but only has a good curability in a surface region directly contacting with UV irradiation, and has poor curability in shadow area, resulting in lack of progress of curing in such a region. Also, the moisture curable resin composition has a problem, which is slow proceeding of curing, thus its speed of curing is not suitable for supporting an automated manufacturing process quickly.

A dually curable resin composition according to one embodiment comprises that the first polyorganosiloxane, the second polyorganosiloxane, a silane compound represented by Chemical Formula 1 or its partially hydrolyzed compound; thus, one embodiment provides the dually curable resin composition that can be quickly cured by photo, and a high degree of hardness as well as excellent curability in shadow area, excellent adhesion and releasability.

In particular, the first polyorganosiloxane comprising at least one alkenyl group and at least one alkoxy group in one molecule is condensed with the second polyorganosiloxane comprising at least two photoreactive functional groups in one molecule on its side chain. As a result, a rapid initial curing speed can be ensured; thus, it is suitable for improving efficiency of manufacturing progress. Furthermore, the dually curable resin composition according to one embodiment comprising the silane compound represented by the Chemical Formula 1 exhibits excellent hardness by processing curing in shadow area which is not cured after photo-curing. In addition, the cured body prepared by using the dually curable resin composition according to one embodiment exhibits excellent adhesion and releasability to the substrate; thus, the electronic device using such cured body exhibits excellent repairability and re-workabilty.

Hereinafter, each component of the dually curable resin composition according to the embodiment is described in detail.

(A) First Polyorganosiloxane

A first polyorganosiloxane (A) according to one embodiment comprises at least one alkenyl group and at least one alkoxy group in one molecule.

In an implementation, the first polyorganosiloxane may comprise at least one alkenyl group and at least two alkoxy groups in one molecule.

The first polyorganosiloxane according to one exemplary may be represented by the following Chemical Formula 2.

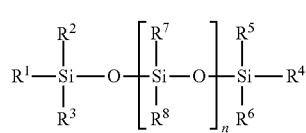

[Chemical Formula 2]

wherein, in Chemical Formula 2, $R^1$ to $R^8$ are each independently substituted or unsubstituted C1 to C20 alkyl, substituted or unsubstituted C3 to C20 cycloalkyl, substituted or unsubstituted C2 to C20 alkenyl, substituted or unsubstituted C2 to C20 alkynyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof; however, at least one of $R^1$ to $R^6$ is substituted or unsubstituted C2 to C20 alkenyl, and at least one of $R^1$ to $R^6$ is substituted or unsubstituted C1 to C20 alkoxy, n is an integer ranging from 50 to 1,000.

In an implementation, at least one of $R^1$ to $R^6$ may be substituted or unsubstituted C2 to C12 alkenyl, for example, may be substituted or unsubstituted C2 to C4 alkenyl, for example, may be a vinyl group, allyl group, butenly group, pentenyl group, hexenyl group, heptenyl group, octenyl group, nonenyl group, decenyl group, undecenyl group, or dodecenyl group.

In an implementation, at least one of $R^1$ to $R^6$ may be substituted or unsubstituted C1 to C10 alkoxy, for example, may be C1 to C4 alkoxy, for example, may be methoxy, ethoxy, propoxy, or butoxy.

In an implementation, at least two of $R^1$ to $R^6$ of Chemical Formula 2 may be substituted or unsubstituted C1 to C20 alkoxy, for example, may be substituted or unsubstituted C1 to C10 alkoxy, for example, may be substituted or unsubstituted C1 to C4 alkoxy.

In an implementation, the weight average molecular weight of the first polyorganosiloxane may be 20,000 to 50,000. Also, the viscosity of the first polyorganosiloxane according to one embodiment may be 400 cst to 3,000 cst. When the viscosity of the first polyorganosiloxane is within the above range, handling and workability of the resulting dually curable resin composition is improved and the mechanical strength of the cured body according to one embodiment is improved.

(B) Second Polyorganosiloxane

A second polyorganosiloxane according to one embodiment comprises at least two photoreactive functional groups in one molecule. The photoreactive functional groups in the second polyorganosiloxane are positioned on its side chain of siloxane backbone, and form crosslinking with the first polyorganosiloxane.

The photoreactive functional group means that it can be exhibit photo-reactivity when irradiated with light (UV/Vis). Specifically, when light is irradiated, a photoreactive functional group causes a photo-reaction, and in this process, the photoreactive functional group positioned on a main chain and/or side chain of siloxane backbone forms a radical by a photoinitiator; thus, a condensation polymerization reaction occurs.

In one exemplary, the photoreactive functional group is positioned on its side chain of the second polyorganosiloxane backbone, thereby exhibiting that the cross-link density increases since the photoreactive functional groups combine with functional groups, i.e., an alkenyl group, which is located at both ends of the first polyorganosiloxane. Also, compared with combining with the photoreactive functional groups that are located at the end of the siloxane backbone, it exhibits excellent hardness, elasticity and strength after curing.

In an implementation, the photoreactive functional group may be a mercapto group (—SH), for example, when the light is irradiated, the mercapto group forms a thiyl radical (—S.) to cause crosslinking with an alkenyl group contained in the first polyorganosiloxane.

The crosslinking by such radicals makes it possible to provide a fast curable dually curable resin composition. As is well-known in the art, many moisture curable silicone materials provide excellent physical properties and performance when fully cured, but have the disadvantage of slow curing; however, the second polyorganosiloxane according to one embodiment solves the disadvantage of the moisture curable resin composition due to containing the photoreactive functional group in the molecule.

The second polyorganosiloxane according to one exemplary may be represented by the following Chemical Formula 3.

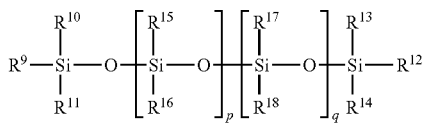

[Chemical Formula 3]

wherein, in Chemical Formula 3, $R^9$ to $R^{14}$ are each independently substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof, $R^{15}$ to $R^{18}$ are each independently a mercapto group, substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, or a combination thereof; however, at least one of $R^{17}$ and $R^{18}$ is a mercapto group or monovalent hydrocarbon group comprising a mercapto group, and p is an integer ranging from 0 to 100 and q is an integer ranging from 2 to 100.

In an implementation, at least one of $R^{17}$ and $R^{18}$ may be a mercapto group (—SH) or substituted or unsubstituted C1 to C20 alkyl comprising a mercapto group.

In an implementation, at least one of $R^{17}$ and $R^{18}$ may be substituted or unsubstituted C1 to C20 alkyl comprising a mercapto group, for example, substituted or unsubstituted C1 to C10 alkyl comprising a mercapto group, for example, substituted or unsubstituted C1 to C4 alkyl comprising a mercapto group.

In an implementation, $R^{15}$ and $R^{16}$ may be each independently are each substituted or unsubstituted C1 to C20 alkyl, $R^{17}$ or $R^{18}$ may be a monovalent hydrocarbon group comprising a mercapto group, wherein p may be an integer ranging from 0 to 100 and q may be an integer ranging from 2 to 100.

In an implementation, $R^9$ to $R^{14}$ may be each independently substituted or unsubstituted C1 to C20 alkyl, for example, may be C1 to C10 alkyl, for example, may be C1 to C4 alkyl.

In an implementation, $R^9$ to $R^{14}$ may be each independently methyl, ethyl, propyl, or butyl.

In an implementation, the weight average molecular weight of the second polyorganosiloxane is 500 to 1,500. Also, the viscosity of the second polyorganosiloxane according to one embodiment is 50 cst to 250 cst. When the viscosity of the second polyorganosiloxane is within the above range, handling and workability of the resulting dually curable resin composition is improved.

The second polyorganosiloxane may comprise 1 to 30 parts by weight, for example, 1 to 20 parts by weight, for example, 5 to 20 parts by weight, for example, 5 to 15 parts by weight, with respect to the first polyorganosiloxane of 100 parts by weight. When the second polyorganosiloxane is comprised within the above range, a rapid initial curing rate can be ensured and excellent storage stability is exhibited.

(C) Silane Compound or its Partially Hydrolyzed Compound

The dually curable resin composition according to one embodiment comprises (C) at least one of a silane compound represented by the following Chemical Formula 1 or its partially hydrolyzed compound. The silane compound represented by Chemical Formula 1 forms a crosslinking with the first polyorganosiloxane.

$(R^x)_2SiX_2$ [Chemical Formula 1]

wherein, in Chemical Formula 1, $R^X$ is a monovalent hydrocarbon group, and X is C1 to C20 alkoxy group, a hydroxy group, halogen, a carboxyl group, or a combination thereof.

The dually curable resin composition according to one embodiment may comprise at least two or more compounds represented by Chemical Formula 1.

In an implementation, $R^x$ may be substituted or unsubstituted C1 to C4 alkyl group, for example, methyl group, ethyl group, propyl group or butyl group.

In an implementation, X may be C1 to c6 alkoxy group, for example, methoxy group or ethoxy group.

In an implementation, the silane compound represented by Chemical Formula 1 may be dimethyldimethoxy silane or dimethyldiethoxy silane, but is not limited thereto.

The silane compound represented by Chemical Formula 1 or its partially hydrolyzed compound may comprise 0.5 to 30 parts by weight, for example, 0.5 to 20 parts by weight, for example, 0.5 to 15 parts by weight, with respect to the first polyorganosiloxane of 100 parts by weight. When the silane compound is comprised within the above range, the curability of the dually curable resin composition according to one embodiment is sufficiently ensured, and at the same time, the storage life of the composition produced under moisture blockage is improved, and the resulting composition is quickly cured by moisture in the air.

(D) Photoinitiator

The dually curable resin composition according to one embodiment comprises at least one photoinitiator. The photoinitiator initiates the photo curing reaction, and conventionally a known photoinitiator which can be usually used in the photo curable resin composition can be used.

The photoinitiator according to one embodiment is not limited to a photoinitiator and a photoinitiator aid, as long as it absorbs light in ultraviolet light or visible light, and is capable of radical polymerization. For example, the photoinitiator may be one or a mixture of two or more selected from the group consisting of 2,2-dimethoxy-1,2-diphenylethane-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one, 2,4,6-trimethylbenzoyldiphenyl phosphine oxide, bis(2,4,6-trimethylbenzoyl)-phenyl phosphine oxide, ethyl(2-(6-trimethylbenzoyl) phenylphosphinate, etc.

In an implementation, the photoinitiator may be 2,4,6-trimethylbenzoyldiphenyl phosphine oxide, bis(2,4,6-trimethylbenzoyl)-phenyl phosphine oxide or ethyl(2,4,6-trimethylbenzoyl) phenyl phosphinate, for example, may be bis(2,4,6-trimethylbenzoyl)-phenyl phosphine oxide.

The photoinitiator may comprise 0.05 to 5 parts by weight, for example, 0.05 to 2 parts by weight, for example, 0.05 to 1 parts by weight, with respect to the first polyorganosiloxane of 100 parts by weight. When the photoinitiator within the above range is comprised in the dually curable resin composition according to the exemplary, the photopolymerization can sufficiently take place at the time of exposure; thus, the photopolymerization sufficiently occurs upon irradiation, rapid curing can proceed without the influence of an unreacted initiator, and a cured body exhibiting sufficient hardness can be obtained.

(E) Condensation Reaction Catalyst

The dually curable resin composition according to one embodiment comprises at least one condensation reaction catalyst. The condensation reaction catalyst (E) according to one embodiment may be titanium compound.

For example, the condensation reaction catalyst may be tetra(isopropoxy)titanium, tetra(n-butoxy)titanium, tetra(t-butoxy)titanium, di(isopropoxy)bis(ethylacetoacetate)titanium, di(isopropoxy)bis(methylacetoacetate)titanium, or di(isopropoxy)bis(acetylacetonate)titanium, but is not limited thereto.

In an implementation, the condensation reaction catalyst may be di(isopropoxy)bis(ethylacetoacetate)titanium.

The condensation reaction catalyst may comprise 0.01 to 10 parts by weight, for example, 0.05 to 10 parts by weight, for example, 0.05 to 5 parts by weight, for example, 0.05 to 3 parts by weight, with respect to the first polyorganosiloxane of 100 parts by weight. When the condensation reaction catalyst within the above range is comprised in the dually curable resin composition according to the exemplary, the resulting composition can be rapidly reacted, thus quickly curing by moisture in the air.

(F) Additive

The dually curable resin composition according to one embodiment may further comprise at least one of additive. The additives (F) according to one embodiment may be reinforcing filler, a photopolymerization inhibitor, a pigment, and a mixture thereof.

The reinforcing filler may comprise, for example, fumed silica fine powder, precipitated silica fine powder, fused silica fine powder, baked silica fine powder, fumed titanium oxide fine powder, glass fiber and hydrophobized fine powders obtained by surface treating these fine powders with organosilane, silazane, and siloxane oligomer, for example, may be fumed silica fine powder. There is no particular limitation on the particle diameter of the fine powder, but a median diameter thereof by a measuring method using the laser diffraction/scattering type particle size distribution may be, for example, in the range of 0.01 µm to 1,000 µm.

The reinforcing filler may comprise 0.1 to 50 parts by weight, for example, 1 to 50 parts by weight, for example, 10 to 50 parts by weight, for example, 10 to 30 parts by weight, with respect to the first polyorganosiloxane of 100 parts by weight.

The photopolymerization inhibitor inhibits the radical reaction during the photo curing of the dually curable resin composition according to one embodiment. In an implementation, the photopolymerization inhibitor comprises hydroquinone, t-butylhydroquinone, p-methoxyphenol, nitrobenzone, BHT(2,6-di-tetra-butyl-4-methylphenol), aluminum N-nitrosophenylhydroxyl-amine, etc.

In an implementation, the photopolymerization inhibitor may be dibutylhydroxytoluene or combination of dibutylhydroxytoluene and Aluminum N-nitrosophenylhydroxyl-amine.

The photopolymerization inhibitor may comprise 0.01 to 1 parts by weight, for example, 0.01 to 0.5 parts by weight, for example, 0.01 to 0.1 parts by weight, with respect to the first polyorganosiloxane of 100 parts by weight.

The pigment is used for visual distinction in the application of a dually curable resin composition, and can be used material that is a color-expressed and can be transmitted by photo (UV-Vis), but is not limited thereto. In an implementation, the pigment is used in small quantities and may comprise sodium alumino sulpho silicate or iron oxide, etc.

In addition, the dually curable resin composition may have a certain amount of other additives added to it, such as an antioxidant, an ultraviolet absorber, a plasticizer, an adhesion promoter, a filler, a photosensitizer and a surfactant, etc., within a range not damaging the physical properties.

According to another embodiment, a cured body prepared by using the dually curable resin composition is provided.

The cured body is prepared by curing the dually curable resin composition according to one embodiment. The method of the curing is not particularly limited, but in one exemplary, at first, the photocuring reaction proceeds by exposure to light (UV-Vis) for rapid curing, and then the composition is further cured by contacting moisture in the air, thus a cured body according to one embodiment is prepared by curing the he UV-Vis exposed part and the shadow area A cured body according to one embodiment exhibits excellent adhesion to a contacted substrate during curing and exhibits good releasability by being able to be efficiently detached from the substrate.

According to yet another embodiment, an electrical and electronic device including the cured body and is provided.

The electrical and electronic device is not particularly limited, but is exemplified by electronic devices that contain electrical circuits or electrodes in which metal oxide film electrodes such as indium tin oxide (ITO) are formed, and metal electrodes of silver, copper, aluminum, gold or the like on a substrate such as glass, epoxy resin, polyimide resin, phenolic resin, ceramic or the like. Examples of such electrodes include electrodes of liquid crystal displays (LCDs) devices, various PCB modules, and the present composition may be used for coating and sealing of electrodes, water-tightness of various electric and electronic devices, protective potting for gas-tightness, gap filling, etc. with fast curing property excellent repairability, and reworkability.

In an implementation, such electronic device is capable of repairing and re-working due to high adhesion to and high releasability from the substrate contacted during curing of the cured body.

In particular, the dually curable resin composition according to one embodiment is useful as a gap-filling composition for electronic or semiconductor articles. The dually curable resin composition maintains good flowable performance, thereby easily filling the narrow gap between said articles. Consequently, the cured body prepared by UV-vis radiation sufficiently fills such narrow gap for electronic or semiconductor articles to seal the gap tightly for water, gas-tightness and reliability thereof. Furthermore, if necessary, the cured body is easily removed without any residue and provides good reworkability to the article having the cured body from the dually curable resin composition.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

Hereinafter, the following examples illustrate the present invention in more detail. However, it is understood that the present invention is not limited by these examples.

EXAMPLES

Synthesis Example 1: Synthesis of a First Polyorganosiloxane (A-1)

100 parts by weight of a hydroxy-terminated polydimethylsiloxane (PDMS) and 5 to 10 parts by weight of vinyltrimethoxy silane were added with 0.03 to 0.1 pats by weight of acetic acid to a 500 ml three-necked flask, and the mixture was mixed with a stirrer and then the temperature was then raised to a temperature of about 150° C. to about 160° C. with stirring. After 3 hours, the reaction mixture was vacuum-cleaved to remove the residual catalyst and vinyltrimethoxysilane.

Examples 1 to 2 and Comparative Examples 1 to 5: Preparation of Dually Curable Resin Composition The first polyorganosiloxane prepared in Synthesis Example 1, the second polyorganosiloxane and the silane compound, and the components described below were mixed in the compositions shown in Table 1, and then stirred at room temperature. Thus, dually curable resin compositions were prepared according to Examples 1 to 2 and Comparative Examples 1 to 5.

(B-1) the second polyorganosiloxane: [(Mercaptopropyl)methylsiloxane]-dimethylsiloxane copolymer represented by following Chemical Formula A having trimethysiloxy groups at both terminals:

[Chemical Formula A]

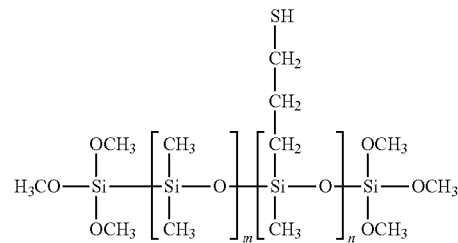

wherein, m is 43, and n is 5.

(B-2) Mercapto dimethoxy end-capped Polydimethylsiloxane represented by the following Chemical Formula B:

[Chemical Formula B]

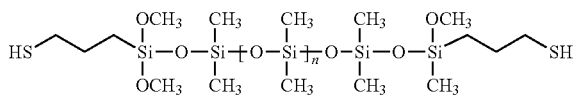

wherein n is a number providing the viscosity (25C) of 450 cst.

(D) Photoinitiator: Ethyl (2,4,6-trimethylbenzoyl)-phenyl phosphinate (E) Condensation reaction catalyst: Diisopropoxy bis (ethylacetoacetate) titanium (F-1) Reinforcing Filler: Fumed silica (F-2) Photopolymerization inhibitor: Dibutylhydroxytoluene (F-3) Pigment: Sodium alumino sulpho silicate

TABLE 1

| | Ex. 1 | Ex. 2 | Comp. Ex. 1 | Comp. Ex. 2 | Comp. Ex. 3 | Comp. Ex. 4 | Comp. Ex. 5 |
|---|---|---|---|---|---|---|---|
| (A-1) A first polyorganosiloxane | 100.00 | 100.00 | 100.00 | — | — | 100.00 | 100.00 |
| (A-2) Trialkoxy end-capped Polydimethylsiloxane (viscosity: 500 to 3000 cst) | — | — | — | 100.00 | — | — | — |
| (A-3) Vinyl end-capped Polydimethylsiloxane (viscosity: 1000 to 3000 cst) | — | — | — | — | 100.00 | — | — |
| (B-1) A second polyorganosiloxane | 12.00 | 14.00 | 14.00 | — | 20.00 | — | — |
| (B-2) Mercapto dimethoxy end-capped Polydimethylsiloxane (viscosity: 450 cst) | — | — | — | — | — | — | 100 |
| (B-3) Trimethylolpropane tris(3-mercaptopropionate) | — | — | — | — | — | 2.00 | — |
| (C-1) Dimethyldimethoxy silane | 0.90 | — | — | 1.00 | — | 0.80 | 1.40 |
| (C-2) Dimethyldiethoxy silane | 5.00 | 5.00 | — | 4.00 | — | 4.50 | 8.00 |
| (C-3) Methyltrimethoxy silane | — | — | 3.10 | — | — | — | — |
| (D) Photoinitiator | 0.50 | 0.50 | 0.50 | — | 0.50 | 0.50 | 0.80 |
| (E) Condensation reaction catalyst | 0.80 | 0.20 | 0.90 | 1.00 | — | 0.80 | 1.40 |
| (F) Additive | | | | | | | |
| (F-1) Reinforcing filler | 20.00 | 20.00 | 18.00 | 18.00 | 20.00 | 20.00 | 17.00 |
| (F-2) Photopolymerization inhibitor | 0.04 | 0.04 | 0.04 | — | 0.04 | 0.04 | 0.07 |
| (F-3) Pigment | 0.16 | — | — | — | — | — | — |

(Unit: parts by weight)

Preparation of Cured Body and Evaluation Thereof

The dually curable resin compositions prepared according to Examples 1 to 2 and Comparative Examples 1 to 5 were exposed to energy ranging from 1,000 to 5,000 mJ/cm² by using a UV LED lamp which irradiated with 395 nm or 405 nm wavelength for photocuring, and the photocuring reaction proceeded. And then, the room temperature curing was proceeded under a condition of 25° C.±2° C., relative humidity of 50%±5%, thus the cured body was prepared.

(1) Adhesion Test and Cohesion Failure

An adhesive layer comprising the resin compositions according to the Examples 1 to 2 and Comparative Examples 1 to 5 was applied on a glass substrate so as to have a size of 25 mm×10 mm×1 mm and another glass substrate was coated thereon to prepare a form capable of a shearing test.

The samples were prepared respectively by the following methods: 1) curing by exposuring by photo (UV-Vis), 2) further curing the photocured sample by curing at room temperature in the condition of 25° C.±2° C. and 50%±5% room humidity (Room Humidity, RH) for 7 days, 3) only by curing at room temperature in the condition of 25° C.±2° C. and 50%±5% room humidity (Room Humidity, RH) for 7 days without exposure by photo(UV-Vis).

The lap shear adhesion test was performed by pulling the cured samples constantly up and down at a speed of 50 mm/min using a tensile testing machine. After the lap shear adhesion test, the condition of the adhesive fracture surface was visually observed, and the ratio of the dually curable resin composition causing cohesive failure was determined as the cohesive failure (hereinafter, CF) ratio.

100% CF ratio means that a thin film of the cured adhesive remains at about 100% on the substrate after the test, which signifies that the releasability is poor.

50% CF ratio means that a thin film of the cured adhesive remains at about 50% on the substrate after the test.

0% CF ratio means that cohesive failure during peeling of the silicone rubber cured product is inhibited, and that the silicone rubber cured product has good releasability from the substrate.

(2) Hardness

The resin composition according to Examples 1 to 2 and Comparative Examples 1 to 5 was prepared by preparing a sheet-like sample having a thickness of 1 to 2 mm and photocuring the samples. The hardness was then evaluated by further curing at room temperature in the condition of 25° C.±2° C. and 50%±5% room humidity (Room Humidity, RH) for 7 days, and laminating them to a thickness of 6 nm to 8 nm, and then measuring the Shore hardness of each cured body.

Shore A hardness was measured using ASTM D 2240-05.

TABLE 2

| | Ex. 1 | Ex. 2 | Comp. Ex. 1 | Comp. Ex. 2 | Comp. Ex. 3 | Comp. Ex. 4 | Comp. Ex. 5 |
|---|---|---|---|---|---|---|---|
| UV expose area (4,000 mJ/cm²) | Cured | Cured | Cured | Uncured | Cured | Cured | Cured/gel |
| Shadow area (after 1 day) | Cured | Cured | Cured | Cured | Uncured | Cured | Cured |
| Cohesion Failure After UV-Vis cure | 0% | 0% | 0% | — | 0% | 0% | 100% |

TABLE 2-continued

|  | Ex. 1 | Ex. 2 | Comp. Ex. 1 | Comp. Ex. 2 | Comp. Ex. 3 | Comp. Ex. 4 | Comp. Ex. 5 |
| --- | --- | --- | --- | --- | --- | --- | --- |
| After UV-Vis + moisture cure | 0% | 0% | 100% | — | — | 50% | 100% |
| After moisture cure | 0% | 0% | 100% | 0% | Uncured | 50% | 100% |
| Hardness (Shore A) | 35 | 32 | 34 | 28 | 38 | 29 | 24 |

The cured body according to Examples 1 to 2 comprises (A) a first polyorganosiloxane comprising at least one alkenyl group and at least one alkoxy group in one molecule, (B) a second polyorganosiloxane comprising at least two photoreactive functional groups in one molecule on its side chain of siloxane backbone and (C) at least one silane compound represented by the following Chemical Formula 1 or its partially hydrolyzed compound, thus, as shown in Table 2, the cured body maintains excellent hardness of Shore A 30 or more, and cohesive failure thereof does not occur after photocuring and/or moisture curing, thus exhibiting excellent releasability.

On the other hand, in Comparative Example 2 comprising only the silane compound which is a room temperature curing resin, there is a problem that the photocuring is not caused and the curing reaction rate is considerably slow. Also, Comparative Example 3 comprising a vinyl end-capped polydimethylsiloxane showed no curing in a shadow area due to not comprising a silane compound, which is necessary for room temperature curing. In addition, Comparative Example 4 comprising an organic curing agent having three mercapto groups exhibits rapid curing properties by light (UV-Vis) reaction and can be cured in the shadow area upon exposure; however, the miscibility with the first polyorganosiloxane was poor, and thus it shows that transparency deteriorated upon mixing, separation during storage, and cohesive failure in adhesion to the substrate after curing.

Unlike the second polyorganosiloxane according to one embodiment, Comparative Example 5, in which the mercapto group in the molecule is located at the end of the siloxane backbone, is reacted with the functional group at the end of the first polyorganosiloxane at first upon curing by the UV-Vis exposure; thus, the reaction of increasing the length of the resin takes precedence over the crosslinking reaction. Accordingly, the curing density of the cured composition was remarkably low and the cured body showed a cohesive failure rate of 100% in terms of adhesion to substrates after photocuring and room temperature curing.

In addition, Comparative Example 1 comprising a silane compound other than the silane compound of Formula 1 according to one embodiment, the cohesive failure rate was 100% in adhesion to a substrate after moisture curing.

As a result, the dually curable resin composition according to one embodiment has excellent adhesion and releasability after photocuring and/or moisture-curing, and the cured body prepared therefrom exhibits excellent hardness. Also, the electronic device comprising such cured body exhibits excellent repairability and re-workablity.

Many modifications and other embodiments of the invention will come to mind to one skilled in the art to which this invention pertains, having the benefit of the teachings presented in the foregoing description. Therefore, it is to be understood that the invention is not to be limited to the specific embodiments disclosed and that modifications and other embodiments are intended to be included within the scope of the appended claims.

The invention claimed is:

1. A dually curable resin composition, the composition comprising:
   (A) 100 parts by weight of a first polyorganosiloxane comprising at least one alkenyl group and at least one alkoxy group in one molecule;
   (B) 1 to 30 parts by weight of a second polyorganosiloxane comprising at least two photoreactive functional groups in one molecule on its side chain of siloxane backbone;
   (C) 0.5 to 30 parts by weight of at least one silane compound represented by the following Chemical Formula 1 or its partially hydrolyzed compound:

$$(R^x)_2SiX_2 \quad \text{[Chemical Formula 1]}$$

wherein $R^x$ is a monovalent hydrocarbon group, and X is a C1 to C20 alkoxy group, a hydroxy group, halogen, a carboxyl group, or a combination thereof;
   (D) 0.05 to 5 parts by weight of at least one photoinitiator; and
   (E) 0.01 to 10 parts by weight of at least one condensation reaction catalyst;
   wherein (B) the second polyorganosiloxane is represented by the following Chemical Formula 3:

[Chemical Formula 3]

$$R^9-\underset{\underset{R^{11}}{|}}{\overset{\overset{R^{10}}{|}}{Si}}-O-\left[\underset{\underset{R^{16}}{|}}{\overset{\overset{R^{15}}{|}}{Si}}-O\right]_p\left[\underset{\underset{R^{18}}{|}}{\overset{\overset{R^{17}}{|}}{Si}}-O\right]_q\underset{\underset{R^{14}}{|}}{\overset{\overset{R^{13}}{|}}{Si}}-R^{12}$$

wherein
   $R^9$ to $R^{14}$ are each independently substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof,
   $R^{15}$ to $R^{18}$ are each independently a mercapto group, a monovalent hydrocarbon group comprising a mercapto group, substituted or unsubstituted C1 to C20 alkyl, substituted or unsubstituted C3 to C20 cycloalkyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, or a combination thereof; provided however, at least one of $R^{17}$ and $R^{18}$ is a mercapto group or a monovalent hydrocarbon group comprising a mercapto group, and p is an integer ranging from 0 to 100 and q is an integer ranging from 2 to 100.

2. The dually curable resin composition of claim 1, wherein in Chemical Formula 3, $R^9$ to $R^{14}$ are each independently substituted or unsubstituted C1 to C10 alkyl.

3. The dually curable resin composition of claim 1, wherein (A) the first polyorganosiloxane is represented by the following Chemical Formula 2:

[Chemical Formula 2]

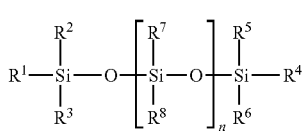

wherein $R^1$ to $R^8$ are each independently substituted or unsubstituted C1 to C20 alkyl, substituted or unsubstituted C3 to C20 cycloalkyl, substituted or unsubstituted C2 to C20 alkenyl, substituted or unsubstituted C2 to C20 alkynyl, substituted or unsubstituted C6 to C20 aryl, substituted or unsubstituted C6 to C20 arylalkyl, substituted or unsubstituted C1 to C20 heteroalkyl, substituted or unsubstituted C1 to C20 heterocycloalkyl, substituted or unsubstituted C1 to C20 heteroaryl, substituted or unsubstituted C1 to C20 alkoxy, or a combination thereof; provided however, at least one of $R^1$ to $R^6$ is substituted or unsubstituted C2 to C20 alkenyl, at least one of $R^1$ to $R^6$ is substituted or unsubstituted C1 to C20 alkoxy, and n is an integer ranging from 50 to 1,000.

4. The dually curable resin composition of claim 3, wherein in Chemical Formula 2, at least one of $R^1$ to $R^6$ is substituted or unsubstituted C2 to C10 alkenyl, and at least one of $R^1$ to $R^6$ is substituted or unsubstituted C1 to C10 alkoxy.

5. The dually curable resin composition of claim 1, wherein in Chemical Formula 3, $R^{15}$ and $R^{16}$ are each independently substituted or unsubstituted C1 to C20 alkyl, and $R^{17}$ or $R^{18}$ is a monovalent hydrocarbon group comprising a mercapto group.

6. The dually curable resin composition of claim 5, wherein in Chemical Formula 3, $R^9$ to $R^{14}$ are each independently substituted or unsubstituted C1 to C10 alkyl.

7. The dually curable resin composition of claim 1, wherein in Chemical Formula 1, $R^X$ is substituted or unsubstituted C1 to C4 alkyl, and X is C1 to C6 alkoxy.

8. The dually curable resin composition of claim 1, wherein (D) the photoinitiator comprises at least one of 2,4,6-trimethylbenzoyl diphenyl phosphine oxide, bis(2,4,6-trimethylbenzoyl)-phenyl phosphine oxide, or ethyl (2,4,6-trimethylbenzoyl) phenylphosphinate.

9. The dually curable resin composition of claim 1, wherein (E) the condensation reaction catalyst comprises at least one of tetra(isopropoxy) titanium, tetra(n-butoxy) titanium, tetra(t-butoxy) titanium, di(isopropoxy)bis(ethylacetoacetate) titanium, di(isopropoxy)bis(methylacetoacetate) titanium, or di(isopropoxy)bis(acetylacetonate) titanium.

10. The dually curable resin composition of claim 1, comprising:

1 to 20 parts by weight of (B) the second polyorganosiloxane;

0.5 to 20 parts by weight of (C) the silane compound or its partially hydrolyzed compound;

0.05 to 2 parts by weight of (D) the photoinitiator; and 0.05 to 10 parts by weight of (E) the condensation reaction catalyst;

each with respect to the 100 parts by weight of (A) the first polyorganosiloxane.

11. The dually curable resin composition of claim 1, further comprising:

(F) an additive selected from the group consisting of reinforcing fillers, photopolymerization inhibitors, pigments, and combinations thereof.

12. A cured body prepared by curing a dually curable resin composition, wherein the dually curable resin composition is according to claim 1.

13. An electronic device comprising the cured body of claim 12.

* * * * *